United States Patent
Weng et al.

(10) Patent No.: US 7,535,392 B2
(45) Date of Patent: May 19, 2009

(54) DELTA SIGMA MODULATOR AND METHOD FOR COMPENSATING DELTA SIGMA MODULATORS FOR LOOP DELAY

(75) Inventors: Chan-Hsiang Weng, Kaohsiung (TW); Tsung-Hsien Lin, Taoyuan County (TW)

(73) Assignees: Mediatek Inc., Hsin-Chu (TW); National Taiwan University, Taipei (TW)

( * ) Notice: Subject to any disclaimer, the term of this patent is extended or adjusted under 35 U.S.C. 154(b) by 0 days.

(21) Appl. No.: 11/867,034

(22) Filed: Oct. 4, 2007

(65) Prior Publication Data

US 2009/0091484 A1   Apr. 9, 2009

(51) Int. Cl.
*H03M 3/00* (2006.01)
(52) U.S. Cl. ................... 341/143; 341/118
(58) Field of Classification Search ............ 341/118, 341/120, 143
See application file for complete search history.

(56) References Cited

U.S. PATENT DOCUMENTS 6,909,394 B2 *  6/2005  Doerrer et al. ............. 341/200
7,221,303 B1 *  5/2007  Melanson ................... 341/143

OTHER PUBLICATIONS

Benabes et al., A Methodology for Designing Continuous-Time Sigma-Delta Modulators, Proceedings of European Design and Test Conference, Mar. 1997, pp. 46-50. IEEE, INSPEC Accession No. 5615029.*

Cherry et al., Excess Loop Delay in Continuous-time Delta-Sigma Modulators, IEEE Transactions on Circuits and Systems II Analog and Digital Signal Processing, Apr. 1999, vol. 46, Issue 4, pp. 376-389.*

"A 20-mW 640-MHz CMOS Continuous-Time $\Sigma\Delta$ ADC with 20-MHz Signal Bandwidth, 80-dB Dynamic Range and 12-bit ENOB" Gerhard Mitteregger et al., Dec. 2006, pp. 2641-2649.

"A 1GHz CMOS Fourth-Order Continuous-Time Bandpass Sigma Delta Modulator for RF Receiver Front End A/D Conversion" K. Praveen Jayakar Thomas et al., 2005, pp. 665-670.

"A Continuous-Time $\Sigma\Delta$ Modulator with 88-dB Dynamic Range and 1.1-MHz Signal Bandwidth" Shouli Yan et al., Jan. 2004, pp. 75-86.

* cited by examiner

*Primary Examiner*—Howard Williams
(74) *Attorney, Agent, or Firm*—Thomas, Kayden, Horstemeyer & Risley (57) ABSTRACT

The invention provides a continuous-time delta sigma modulator. In one embodiment, the continuous-time delta sigma modulator comprises a series of integrators, a quantizer, and a loop delay compensation circuit. The integrators are coupled in series and generate an analog output signal according to an analog input signal. The quantizer quantizes the analog output signal according to a reference voltage to generate a digital output signal as the output of the continuous-time delta sigma modulator. The loop delay compensation circuit adjusts the reference voltage of the quantizer according to the digital output signal to compensate the continuous-time delta sigma modulator for a loop delay.

15 Claims, 7 Drawing Sheets

DELTA SIGMA MODULATOR AND METHOD FOR COMPENSATING DELTA SIGMA MODULATORS FOR LOOP DELAY

BACKGROUND OF THE INVENTION

1. Field of the Invention

The invention relates to delta sigma modulators, and more particularly to compensation for loop delay of delta sigma modulators.

2. Description of the Related Art

Delta sigma modulators can be used to execute analog-to-digital conversion or digital-to-analog conversion. Conventional delta sigma modulators are discrete-time delta sigma modulators. Discrete-time delta sigma modulators can provide output signals with high resolutions and low bandwidths. To provide output signals with higher bandwidths and higher resolutions, continuous-time delta sigma modulators have been introduced. Continuous-time delta-sigma modulators, however, may generate unstable output signals due to signal delay in feedback loops. Thus, a method for compensating continuous-time delta-sigma modulators for loop delay is required so as to provide continuous-time delta-sigma modulators with high stability.

Figure 1A:
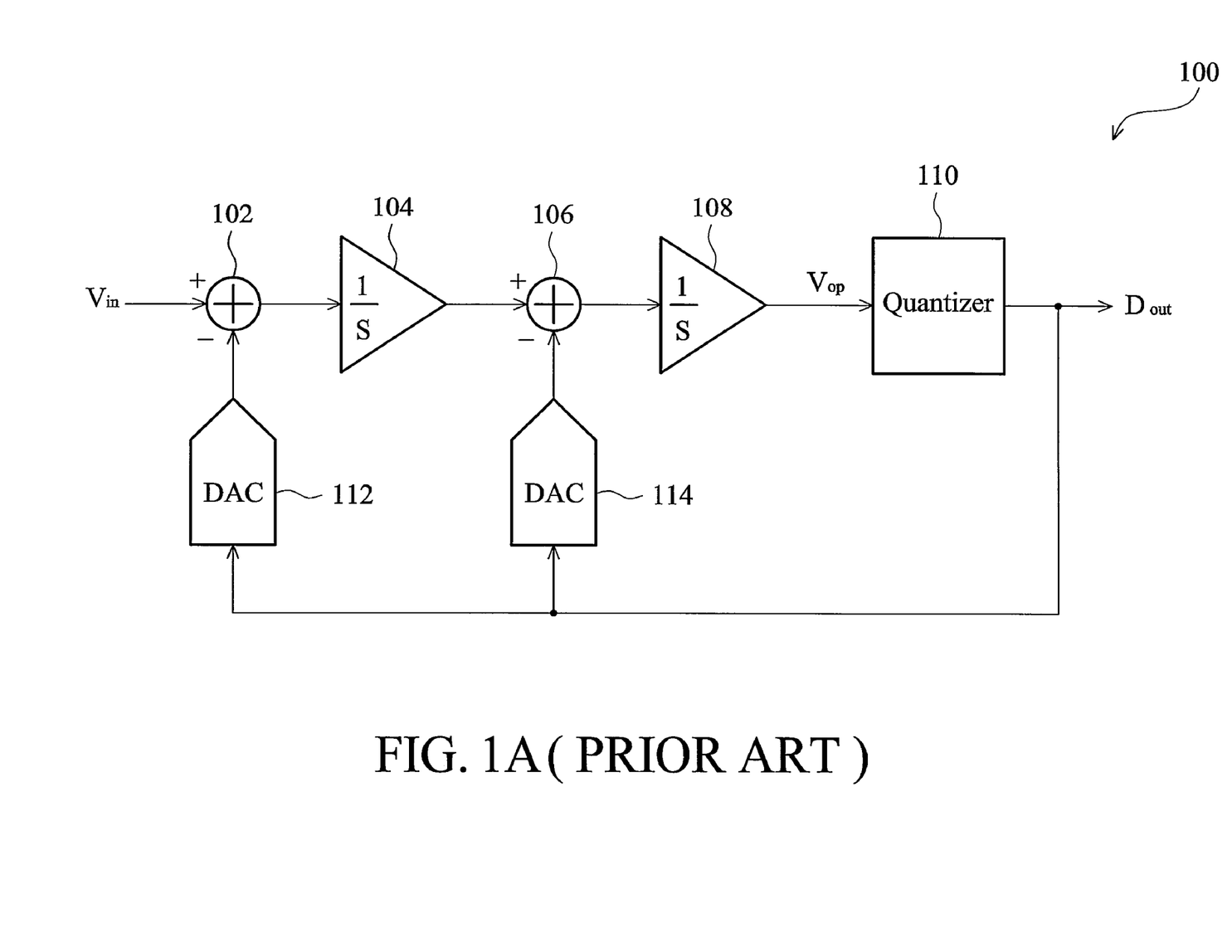
FIG. 1A is a block diagram of a conventional second-order continuous-time delta sigma modulator.

Referring to FIG. 1A, a block diagram of a conventional second-order continuous-time delta sigma modulator 100 is shown. The second-order delta sigma modulator 100 comprises two integrators 104 and 108, two summation stages 102 and 106, two digital-to-analog converters 112 and 114, and a quantizer 110. Because the delta sigma modulator 100 is a second delta-sigma modulator, it comprises two integrators 104 and 108 connected in series. The integrators 104 and 108 generate an analog output signal $V_{op}$ according to an analog input signal $V_{in}$. The quantizer 110 quantizes the analog input signal $V_{in}$ to generate a digital output signal $D_{out}$ as the output of the delta-sigma modulator 100. The digital output signal $D_{out}$ is then converted from digital to analog by digital-to-analog converters 112 and 114, and fed back and respectively subtracted from input signals of the integrators 104 and 106 by summing stages 102 and 106.

Figure 1B:
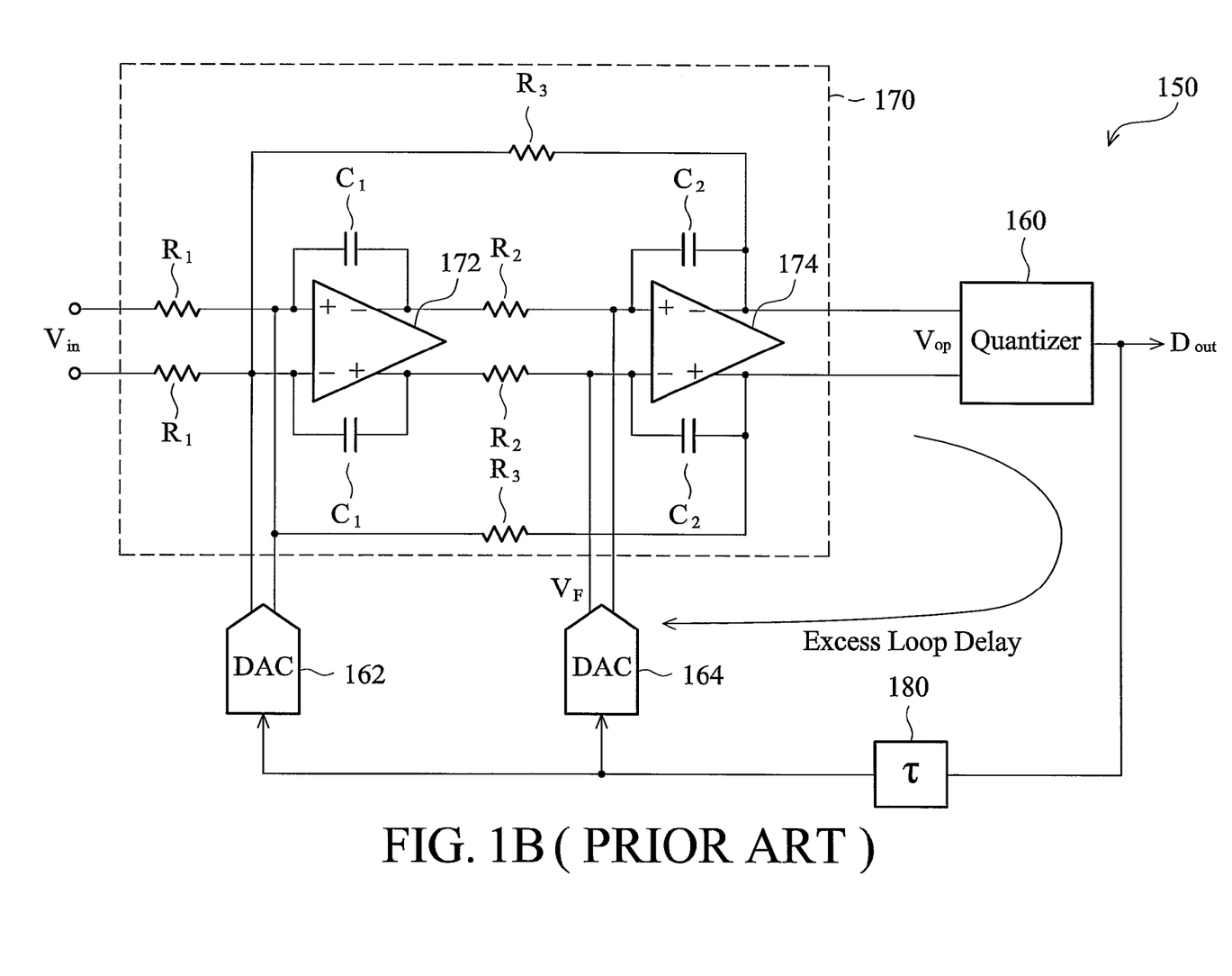
FIG. 1B shows a physical circuit of the second-order continuous-time delta sigma modulator of FIG. 1.

Referring to FIG. 1B, a physical circuit 150 of the second-order continuous-time delta sigma modulator 100 is shown. The integrators 104, 108 and the summation stages 102, 106 of delta sigma modulator 100 are physically formed with a circuit 170 comprising two operational amplifiers 172 and 174. The quantizer 160 and digital-to-analog converters 162, 164 of the circuit 150 respectively correspond to the quantizer 110 and digital-to-analog converters 112, 114 of the delta sigma modulator 100.

The feedback loop feeding the digital output signal $D_{out}$ back to the summing stages 102 and 106, but however often delays the digital output signal $D_{out}$ for a delay period of a few hundreds of a nanoseconds, referred to as loop delay. The excess loop delay is denoted by a delay time $\tau$ in the feedback loop of FIG. 1B. The loop delay negatively affects the stability of the system. Modules in the feedback loop, such as the quantizer 110 and the digital-to-analog converters 112 and 114, may delay the digital output signal $D_{out}$ in the feedback loop. If the loop delay exceeds a threshold of about 800 nanoseconds, the delta sigma modulator 100 becomes an unstable system, and signal-to-noise ratio of output signal $D_{out}$ will be greatly reduced.

Figure 2A:
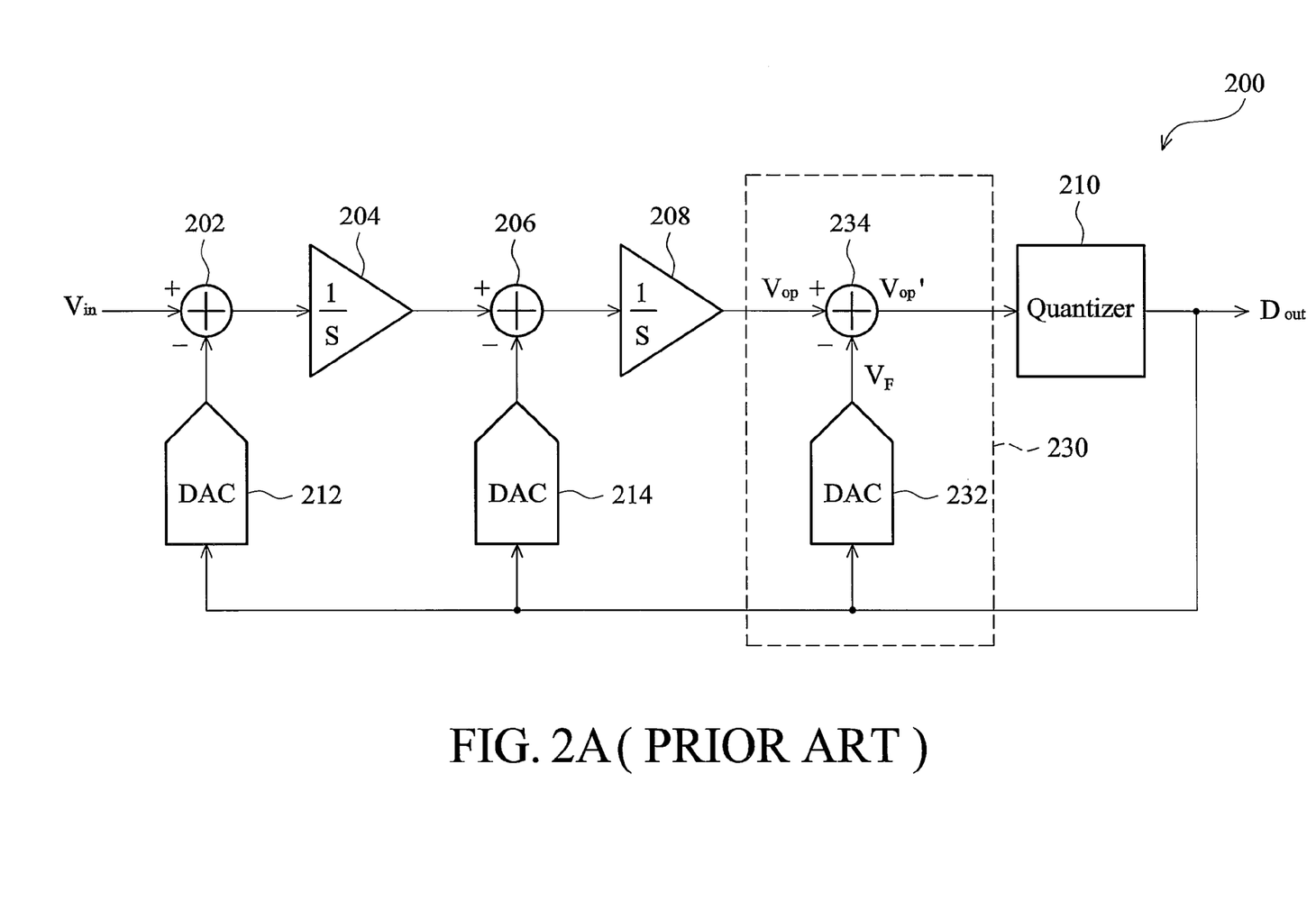
FIG. 2A is a block diagram of a delta sigma modulator with a compensation feedback path compensating for a loop delay.

To compensate for the loop delay in the feedback path, an extra feedback path is added to compensate the input signal of the quantizer. Referring to FIG. 2A, a block diagram of a delta sigma modulator 200 with a compensation feedback path 230 compensating for a loop delay is shown. The compensation feedback path 230 comprises a digital-to-analog converter 232 and a summation stage 234. The digital-to-analog converter 232 converts the digital output signal $D_{out}$ from digital to analog to obtain a feedback signal $V_F$. The summation stage 234 then subtracts the feedback signal $V_F$ from the analog output signal $V_{op}$ generated by the integrator 208 to obtain a compensated signal $V_{op}'$ as the input of the quantizer 210. Because the input signal $V_{op}'$ of the quantizer 210 is compensated for the loop delay, the output signal $D_{out}$ of the quantizer 210 is stabilized and has a higher signal-to-noise ratio.

The rationale for adding the compensation feedback path 230 is illustrated in the following. Suppose the delta-sigma modulator 100 without loop delay has a noise transfer function of n(z)/d(z). If a delay module 180 causing the loop delay is added to the delta-sigma modulator 100 to obtain the delta-sigma modulator 150, the noise transfer function of the delta-sigma modulator 150 is then determined by the following algorithm:

$$NTF(z, \tau_d) = \frac{n(z)}{d(z)} + z^{-1}\frac{A(\tau_d)z^2 + B(\tau_d)z + C(\tau_d)}{d(z)};$$

wherein $\tau_d$ is the loop delay. The high order terms $[A(\tau_d)z^2+B(\tau_d)z+C(\tau_d)]$ causes the system to be unstable. If a compensation feedback path 230 is added to the delta-sigma modulator 150 to obtain the delta sigma modulator 200, the delta-sigma modulator 200 is then determined by the following algorithm:

$$NTF(z, \tau_d) = \frac{n(z)}{d(z)} + z^{-1}\frac{A(\tau_d)z^2 + B(\tau_d)z + C(\tau_d)}{d(z)} + z^{-1}\frac{-a_f d(z)z^{-1}}{d(z)};$$

wherein the $a_f$ is the gain of the feedback loop. Thus, the new term $[-a_f \times d(z) \times z^{-1}]$ due to the compensation feedback path 230 cancels off the high order terms $[A(\tau_d)z^2+B(\tau_d)z+C(\tau_d)]$ to compensate for the loop delay effect.

Figure 2B:
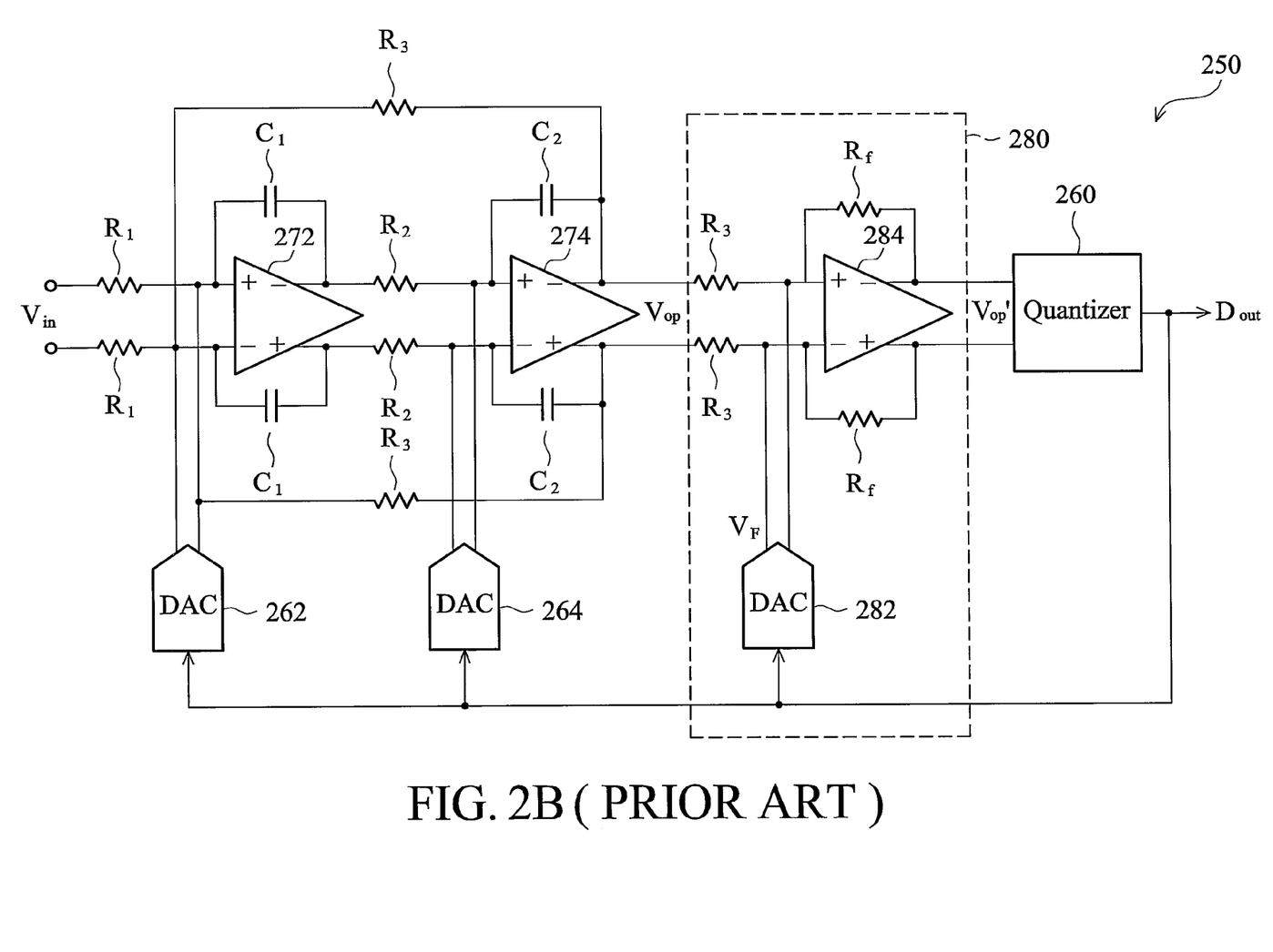
FIG. 2B shows a physical circuit of the delta sigma modulator of FIG. 2.

Although the feedback path 230 compensates the delta-sigma modulator 200 for loop delay, the feedback path 230 requires expensive hardware cost. Referring to FIG. 2B, a physical circuit 250 of the delta sigma modulator 200 of FIG. 2 is shown. The compensation feedback path 230 is implemented with a circuit 280 comprising a digital-to-analog converter 282 and an operational amplifier 284. The operational amplifier 284 is a complex circuit and requires great amount of currents to operate, complicating the circuit design of the delta-sigma modulator 200 and increasing power consumption. Thus, a method for compensating a continuous-time delta-sigma modulator for loop delay with low circuit complexity and low power consumption is required.

BRIEF SUMMARY OF THE INVENTION

The invention provides a continuous-time delta sigma modulator. In one embodiment, the continuous-time delta sigma modulator comprises a series of integrators, a quantizer, and a loop delay compensation circuit. The integrators are coupled in series and generate an analog output signal according to an analog input signal. The quantizer quantizes the analog output signal according to a reference voltage to generate a digital output signal as the output of the continuous-time delta sigma modulator. The loop delay compensation circuit adjusts the reference voltage of the quantizer according to the digital output signal to compensate the continuous-time delta sigma modulator for a loop delay.

The invention also provides a method for compensating a continuous-time delta sigma modulator for a loop delay. In one embodiment, a last one of a series of integrators of the continuous-time delta sigma modulator generates an analog output signal. First, the analog output signal is quantized according to a reference voltage to generate a digital output signal as the output of the continuous-time delta sigma modulator. The reference voltage is then adjusted according to the digital output signal to compensate the continuous-time delta sigma modulator for a loop delay.

The invention also provides a loop delay compensation circuit, coupled to a quantizer of a continuous-time delta sigma modulator. The loop delay compensation circuit adjusts a reference voltage of the quantizer according to a digital output signal of the quantizer to compensate the continuous-time delta sigma modulator for a loop delay.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 3:
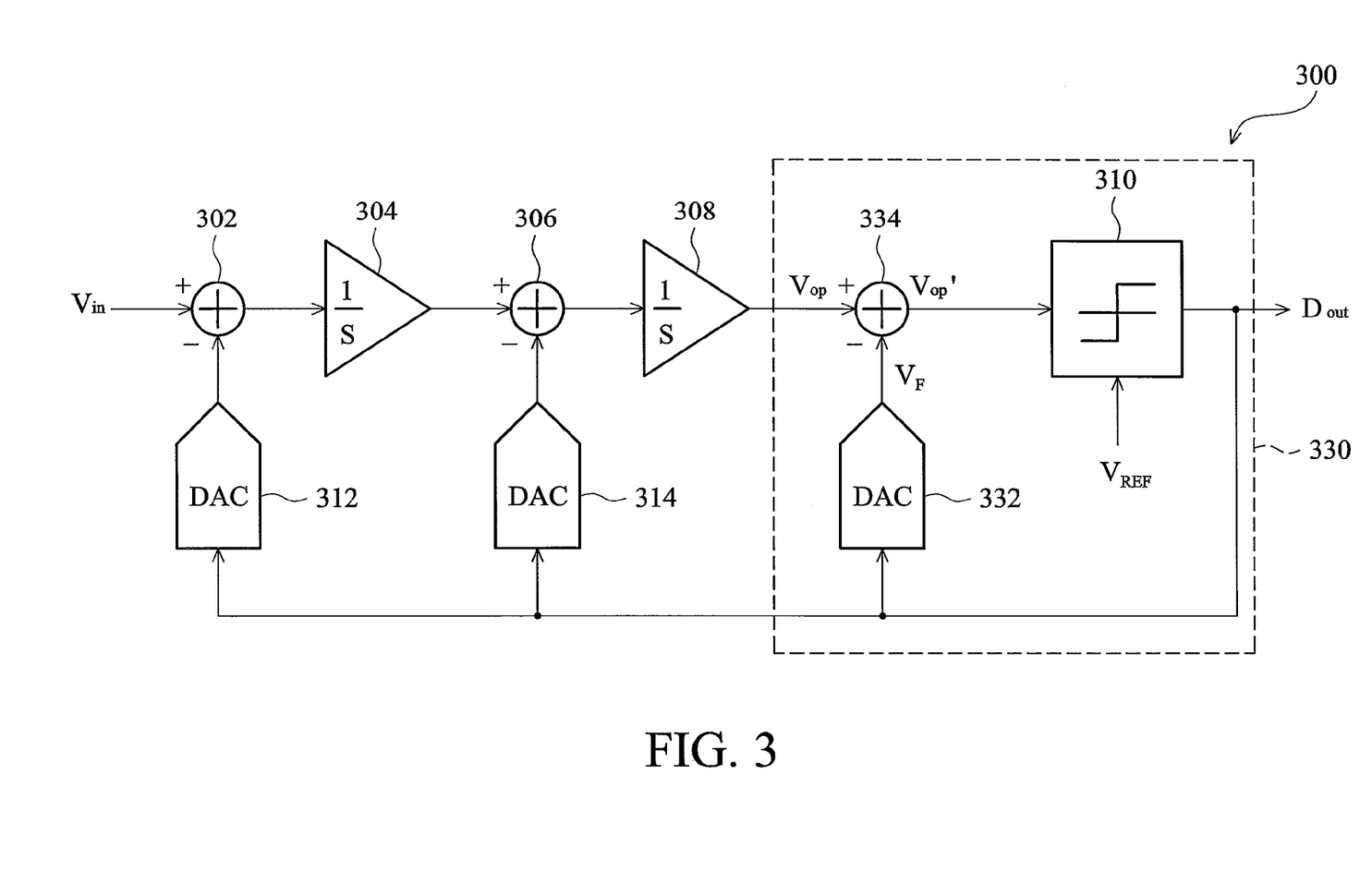
FIG. 3 is a block diagram of a continuous-time delta-sigma modulator with a compensation feedback loop.

Referring to FIG. 3, a block diagram of a continuous-time delta-sigma modulator 300 with a compensation feedback loop is shown. A last integrator 308 with the highest order generates an analog output signal $V_{op}$. A compensation feedback loop comprising a digital-to-analog converter 332 and a summation stage 334 compensates the delta-sigma modulator 300 for loop delay. The digital-to-analog converter 332 converts a digital output signal $D_{out}$ from digital to analog to obtain a feedback signal $V_F$. The summation stage 334 subtracts the feedback signal $V_F$ from the analog output signal $V_{op}$ to obtain a compensated signal $V_{op}'$. The quantizer 310 then quantizes the compensated signal $V_{op}'$ according to a reference voltage $V_{REF}$ to obtain the digital output signal $D_{out}$ as the final output of the delta-sigma modulator 300.

Because the compensated signal $V_{op}'$ is obtained by subtracting the feedback signal $V_F$ from the analog output signal $V_{op}$, the compensated signal $V_{op}'$ generated by the summing stage 334 can be expressed as $(V_{op}-V_F)$. The quantizer 310 then compares the compensated signal $(V_{op}-V_F)$ with the reference signal $V_{REF}$. If the compensated signal $(V_{op}-V_F)$ is greater then the reference signal $V_{REF}$, the quantizer 310 outputs a value of 1 as the digital output signal $D_{out}$. Otherwise, if the compensated signal $(V_{op}-V_F)$ is smaller then the reference signal $V_{REF}$, the quantizer 310 outputs a value of 0 as the digital output signal $D_{out}$. Thus, the quantizer 310 determines the value of the digital output signal $D_{out}$ based on whether the value of the function $[(V_{op}-V_F)-V_{REF}]$ is greater than 0.

The function $[(V_{op}-V_F)-V_{REF}]$ can be rewritten as $[V_{op}-(V_F+V_{REF})]$. If the voltage $(V_F+V_{REF})$ is expressed as a new reference voltage $V_{REF}'$ which changes with the feedback voltage $V_F$, the function $[(V_{op}-V_F)-V_{REF}]$ becomes $[V_{op}-V_{REF}']$. A new loop delay compensation circuit operating according to the function $[V_{op}-V_{REF}']$ is thus introduced to substitute for the digital-to-analog converter 332, the summation stage 334, and the quantizer 310 of the original circuit 330. The new loop delay compensation circuit is a quantizer quantizing the analog output signal $V_{op}$ according to the new reference voltage $V_{REF}'$ to obtain the digital output signal $D_{out}$, wherein the new reference voltage $V_{REF}'$ is adjusted according to the feedback voltage $V_F$ converted from the digital output signal $D_{out}$. Because the new reference voltage $V_{REF}'$ is equal to $(V_F+V_{REF})$ and the feedback voltage $V_F$ is converted from the digital output signal $D_{out}$, the new reference voltage $V_{REF}'$ changes in proportional to the digital output signal $D_{out}$.

Figure 4:
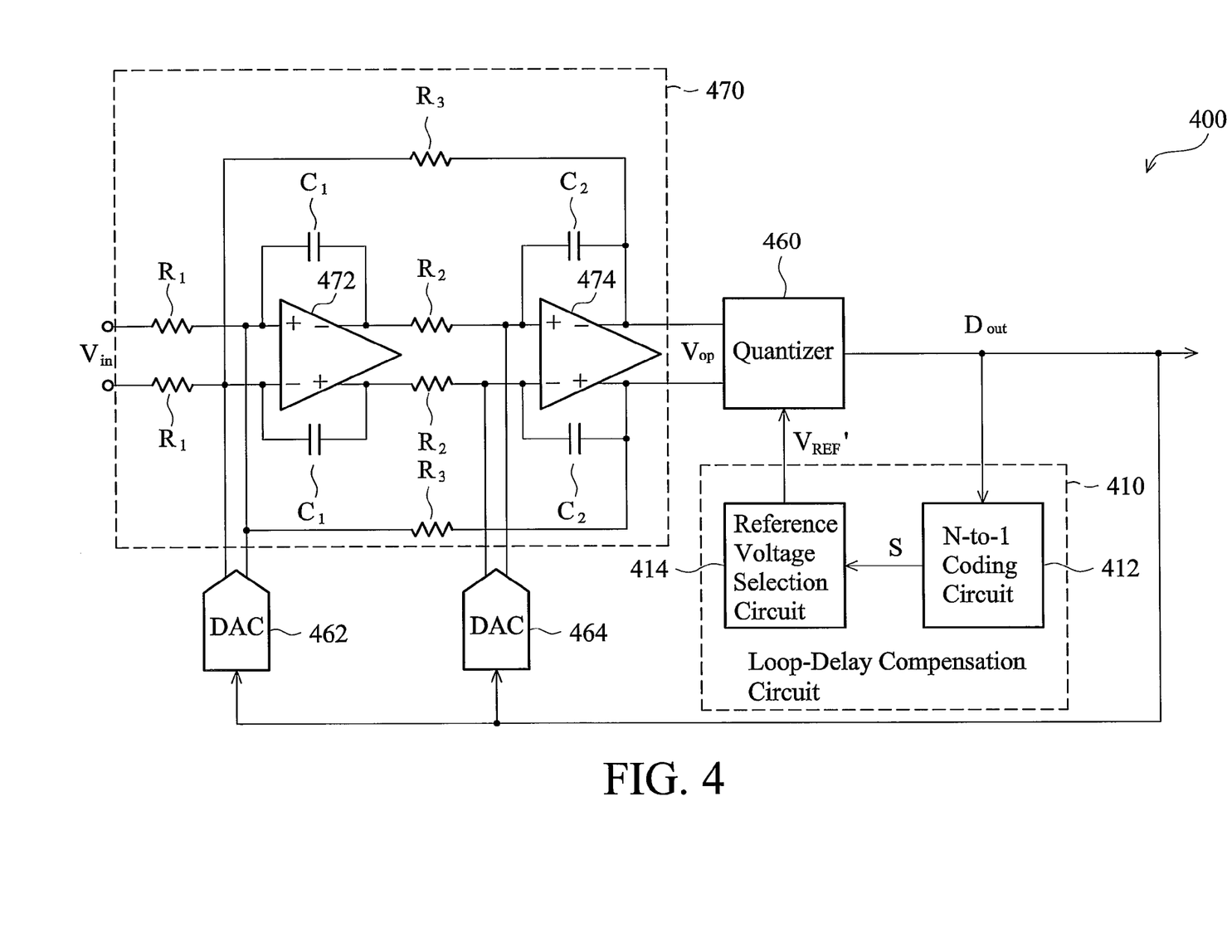
FIG. 4 shows a continuous-time delta-sigma modulator with a loop-delay compensation circuit according to the invention.

Referring to FIG. 4, a continuous-time delta-sigma modulator 400 with a loop-delay compensation circuit 410 according to the invention is shown. A circuit 470 of the continuous-time delta-sigma modulator 400 is used to implement a series of integrators and a series of summation stages, just like the integrators 304 and 308 and the summation stages 302 and 306 of the continuous-time delta-sigma modulator 300 of FIG. 3. The series of integrators of the circuit 470 generate an analog output signal $V_{op}$ according to an analog input signal $V_{in}$ and feed back signals converted from a digital output signal $D_{out}$. After a last integrator with the highest order generates the analog output signal $V_{op}$, the quantizer 460 quantizes the analog output signal $V_{op}$ according to a reference voltage $V_{REF}'$ to obtain a digital output signal $D_{out}$ as the final output of the delta sigma modulator 400.

The loop delay compensation circuit 410 adjusts the reference voltage $V_{REF}'$ of the quantizer 460 according to the digital output signal $D_{out}$ to compensate the continuous-time delta sigma modulator 400 for loop delay. In one embodiment, the loop-delay compensation circuit 410 comprises an N-to-1 coding circuit 412 and a reference voltage selection circuit 414. Suppose the digital output signal $D_{out}$ has N kinds of values. The N-to-1 coding circuit 412 first generates N selection signals $S_1, S_2, \ldots, S_N$, only one of which is enabled according to the value of the digital output signal $D_{out}$. The reference voltage selection circuit 414 then generates a voltage level corresponding to the enabled selection signal as the reference voltage $V_{REF}'$. Thus, the reference voltage $V_{REF}'$ is adjusted according to the value of the digital output signal $D_{out}$. Because the quantizer 460 quantizes the analog output signal $V_{op}$ according to the adjusted reference voltage $V_{REF}'$ to obtain the digital output signal $D_{out}$, the digital output signal $D_{out}$ is compensated for loop delay caused in the feedback path.

Figure 5:
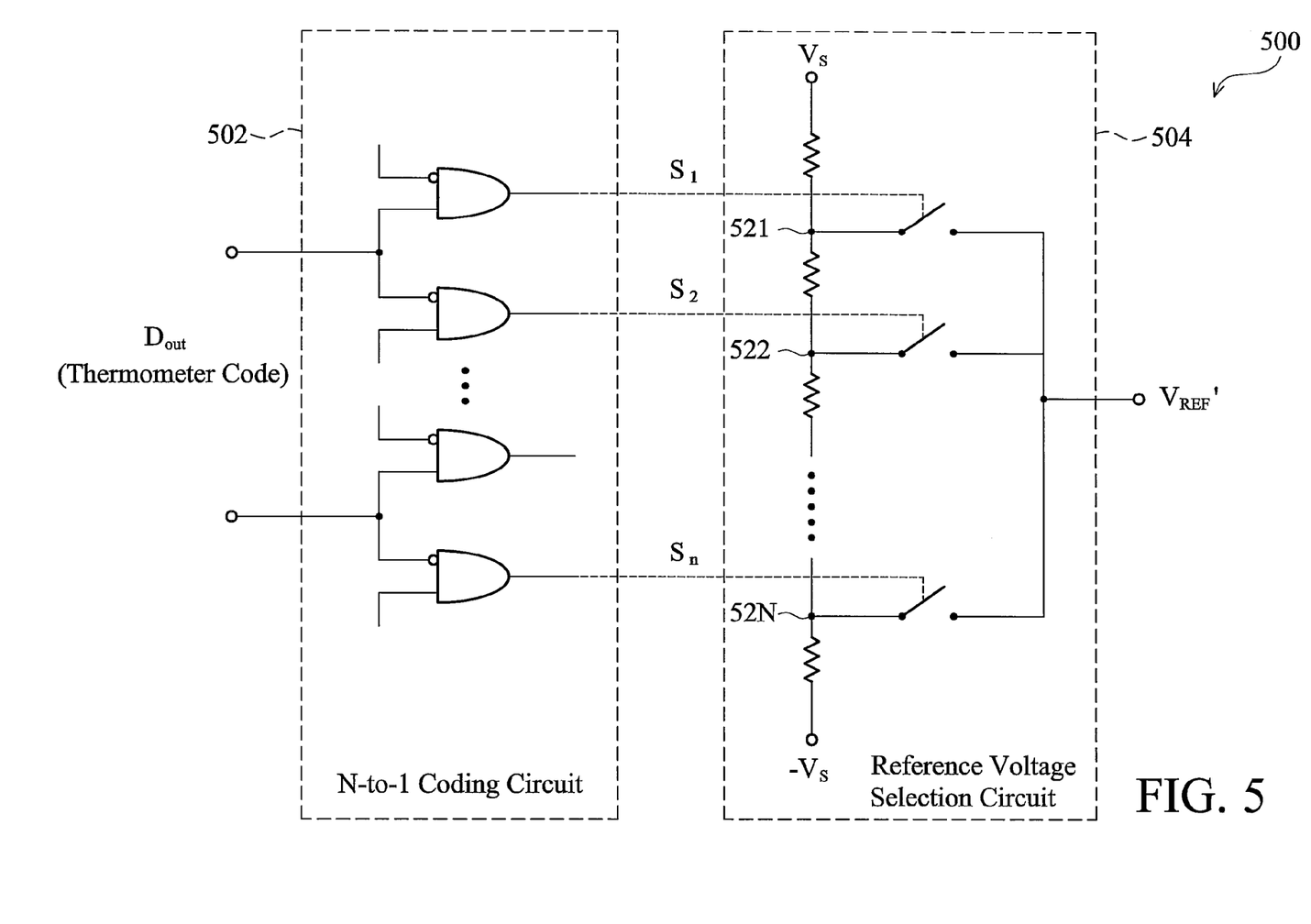
FIG. 5 is a block diagram of an embodiment of a loop delay compensation circuit according to the invention.

Referring to FIG. 5, a block diagram of an embodiment of a loop delay compensation circuit 500 according to the invention is shown. The loop delay compensation circuit 500 comprises an N-to-1 coding circuit 502 and a reference voltage selection circuit 504. Suppose the digital output signal $D_{out}$ is an N-bit thermometer code. The N-to-1 coding circuit 502 is a logical circuits converting the N-bit thermometer code of the digital output signal $D_{out}$ to a one-of-N code as the selection signals $S_1, S_2, \ldots, S_N$. Thus, only one selection signal is enabled according to the digital output signal $D_{out}$. The reference voltage selection circuit 504 comprises (N+1) resistors connected in series between a voltage source Vs and a ground −Vs. Every two of the (N+1) resistors are connected by one of N coupling nodes 521, 522, ..., 52N. The voltage of nodes 521, 522, ... 52N respectively reflect the reference voltages corresponding to the N kinds of values of the digital output signal $D_{out}$. After the N-to-1 coding circuit 502 generates the signals $S_1, S_2, \ldots, S_N$, the enabled selection signal then connects one of N nodes to an output node of the reference voltage selection circuit 504, thus outputting the voltage of the selected node as the reference voltage $V_{REF}'$.

Driven by the cooperative process between the quantizer 460 and the loop-delay compensation circuit 410, loop delay of the delta-sigma modulator 400 is compensated similar to that of the delta-sigma modulator 250 of FIG. 2B. The delta-sigma modulator 250 of FIG. 2B, however, comprises an extra operational amplifier 284, having a complicated circuit design requiring additional current to operate. The loop-delay compensation circuit 500 of FIG. 5, however, comprises only passive circuit elements, having a more simpler circuit design requiring less current to operate. Thus, compared with the traditional delta-sigma modulator 250 in FIG. 2B, the continuous-time delta-sigma modulator 400 comprising a loop-delay compensation circuit of the invention has lower costs and lower power consumption.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A continuous-time delta sigma modulator, comprising:
   a series of integrators, coupled in series, generating an analog output signal according to an analog input signal;
   a quantizer, coupled to a last integrator with the highest order in the series, quantizing the analog output signal according to a reference voltage to generate a digital output signal as the output of the continuous-time delta sigma modulator, wherein the digital output signal has N kinds of values; and
   a loop delay compensation circuit, coupled to the quantizer, adjusting the reference voltage of the quantizer according to the digital output signal to compensate the continuous-time delta sigma modulator for a loop delay, comprising:
   a N-to-1 coding circuit, coupled to the quantizer, enabling one of N selection signals according to the digital output signal; and
   a reference voltage selection circuit, coupled to the N-to-1 coding circuit, generating a voltage level corresponding to the enabled selection signal as the reference voltage.

2. The continuous-time delta sigma modulator as claimed in claim 1, wherein the loop delay compensation circuit adjusts the reference voltage in such a way that the reference voltage changes in proportional to the digital output signal.

3. The continuous-time delta sigma modulator as claimed in claim 1, wherein the digital output signal is an N-bit thermometer code, and the N-to-1 coding circuit converts the thermometer code to a one-of-N code as the selection signals.

4. The continuous-time delta sigma modulator as claimed in claim 1, wherein the reference voltage selection circuit comprises (N+1) resistors connected in series between a voltage source and a ground, and the selection signals select one of N nodes connecting two of the resistors to output the voltage of the selected node as the reference voltage.

5. The continuous-time delta sigma modulator as claimed in claim 1, wherein the continuous-time delta sigma modulator comprises a feedback loop feeding the digital output signal back to the integrators, and the loop delay is generated in the feedback loop.

6. A method for compensating a continuous-time delta sigma modulator for a loop delay, wherein a last one of a series of integrators of the continuous-time delta sigma modulator generates an analog output signal, the method comprising:
   quantizing the analog output signal according to a reference voltage to generate a digital output signal as the output of the continuous-time delta sigma modulator;
   enabling one of N selection signals according to the digital output signal; and
   adjusting the reference voltage according to the enabled selection signal to compensate the continuous-time delta sigma modulator for a loop delay;
   wherein the digital output signal is an N-bit thermometer code, and the selection signals are a one-of-N code converted from the thermometer code.

7. The method as claimed in claim 6, wherein the reference voltage is adjusted in such a way that the reference voltage changes in proportional to the digital output signal.

8. The method as claimed in claim 6, wherein the a reference voltage selection circuit comprises (N+1) resistors connected in series between a voltage source and a ground, N nodes respectively connect two of the (N+1) resistors, and the generation of the reference voltage comprises:
   selecting one of N nodes according to the selection signals; and
   outputting the voltage of the selected node as the reference voltage.

9. The method as claimed in claim 6, wherein a feedback loop of the continuous-time delta sigma modulator feeds the digital output signal back to the integrators, and the loop delay is generated in the feedback loop.

10. A loop delay compensation circuit, coupled to a quantizer of a continuous-time delta sigma modulator, adjusting a reference voltage of the quantizer according to a digital output signal of the quantizer to compensate the continuous-time delta sigma modulator for a loop delay, comprising:
    a N-to-1 coding circuit, coupled to the quantizer, enabling one of N selection signals according to the digital output signal; and
    a reference voltage selection circuit, coupled to the N-to-1 coding circuit, generating a voltage level corresponding to the enabled selection signal as the reference voltage;
    wherein the digital output signal has N kinds of values.

11. The loop delay compensation circuit as claimed in claim 10, wherein the loop delay compensation circuit adjusts the reference voltage in such a way that the reference voltage changes in proportional to the digital output signal.

12. The loop delay compensation circuit as claimed in claim 10, wherein a last one of a series of integrators of the continuous-time delta sigma modulator generates an analog output signal, and the quantizer quantizes the analog output signal according to the reference voltage to generate the digital output signal as the output of the continuous-time delta sigma modulator.

13. The loop delay compensation circuit as claimed in claim 12, wherein the continuous-time delta sigma modulator comprises a feedback loop feeding the digital output signal back to the integrators, and the loop delay is generated in the feedback loop.

14. The loop delay compensation circuit as claimed in claim 10, wherein the digital output signal is an N-bit thermometer code, and the N-to-1 coding circuit converts the thermometer code to a one-of-N code as the selection signals.

15. The loop delay compensation circuit as claimed in claim 10, wherein the reference voltage selection circuit comprises (N+1) resistors connected in series between a voltage source and a ground, N nodes respectively connect two of the (N+1) resistors, and the voltage level of one of N nodes selected by the selection signal is output as the reference voltage.

* * * * *